(12) United States Patent
Herchen et al.

(10) Patent No.: US 6,444,040 B1
(45) Date of Patent: Sep. 3, 2002

(54) GAS DISTRIBUTION PLATE

(75) Inventors: Harald Herchen, San Jose; David Palagashvili, Mountain View; Dmitry Lubomirsky, Cupertino; Alex Schreiber, San Jose, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/565,150

(22) Filed: May 5, 2000

(51) Int. Cl.[7] ............................................. C23C 16/00
(52) U.S. Cl. .................. 118/715; 156/345.34; 239/556; 239/558; 239/568
(58) Field of Search .................. 156/345; 118/715; 239/556, 558, 568

(56) References Cited

U.S. PATENT DOCUMENTS

| | | | | |
|---|---|---|---|---|
| 5,338,363 A | * | 8/1994 | Kawata | 118/725 |
| 5,423,936 A | * | 6/1995 | Tomita | 156/345 |
| 5,447,570 A | * | 9/1995 | Schmitz | 118/728 |
| 5,589,002 A | * | 12/1996 | Su | 156/345 |
| 5,614,026 A | | 3/1997 | Williams | 118/723 ME |
| 5,746,875 A | * | 5/1998 | Maydan | 118/345 |
| 5,919,332 A | * | 7/1999 | Koshiishi | 156/345 |
| 5,985,033 A | * | 11/1999 | Yudovsky | 118/715 |
| 6,007,635 A | * | 12/1999 | Mahawili | 118/728 |
| 6,027,604 A | * | 2/2000 | Lim | 156/345 |
| 6,036,782 A | * | 3/2000 | Tanaka | 118/715 |
| 6,050,216 A | * | 4/2000 | Szapucki | 156/345 |
| 6,053,982 A | * | 4/2000 | Halpin | 118/715 |
| 6,123,775 A | * | 9/2000 | Hao | 156/345 |
| 6,123,791 A | * | 9/2000 | Han | 118/723 AN |

OTHER PUBLICATIONS

Webster's New Collegiate Dictionary, G & C Merriam Co., 1975, p. 1094.*

* cited by examiner

Primary Examiner—Richard Bueker
(74) Attorney, Agent, or Firm—Moser Patterson & Sheridan; Joseph Bach

(57) ABSTRACT

An apparatus for use in a substrate processing system. The apparatus is generally a fluid distribution plate comprising an inner disk and an outer ring. The fluid distribution plate has a plurality of openings for fluid distribution and at least one slot defined therein.

18 Claims, 5 Drawing Sheets

GAS DISTRIBUTION PLATE

CROSS REFERENCES TO RELATED APPLICATIONS

This application claims priority to commonly assigned U.S. provisional patent application, Ser. No. 60/132,781, entitled "Gas Distribution Plate," filed on May 6, 1999, which is herein incorporated by reference.

BACKGROUND OF THE DISCLOSURE

1. Field of the Invention

The invention relates to an apparatus for fluid distribution in a substrate processing system, and more particularly, to a gas distribution plate in a semiconductor wafer processing system.

2. Background of the Invention

Gas distribution plates (GDP's) are used for delivering gases from a source to a process chamber. The gases are used for various phases of semiconductor device manufacturing including etching and chemical vapor deposition (CVD). The gases are heated, especially in metal etching process, to temperatures in the range of 600–2000° C. Typically, a GDP is fabricated from quartz and U.S. Pat. No. 5,614,026 discloses such a device for uniformly distributing process gas over a semiconductor surface in a plasma-based stripping process. Quartz exhibits good mechanical strength when exposed to thermal gradients. More specifically, the hot gases are usually delivered from the source to the GDP via a 1 in. diameter pipe. These gases then flow across the GDP (typically a single plate 8 in. diameter) and pass through openings in the GDP. The center of the GDP, receiving the greatest concentration of hot gases, is heated more than points radially outward therefrom. The change in temperature across the GDP causes a stress in the atomic bonds of quartz. This stress however does not exceed the mechanical strength of the quartz; therefore, it does not break. However, in certain circumstances, a fluorine-based gas is introduced to the process chamber for etching portions of a substrate during semiconductor device formation. Unfortunately, quartz is etched by fluorine. As such, two undesirable conditions occur. First, quartz is released into the chamber environment, which causes contamination in the substrate. Second, the quality and integrity of the GDP is compromised as a result of the etching.

Alternately, the GDP is fabricated from a ceramic material such as oxides including alumina ($Al_2O_3$), magnesium oxide ($MgO_2$) and the like. Ceramic materials have an advantage over quartz when it is necessary to use a fluorine-based active species (gas) for substrate processing. Unfortunately, the mechanical strength of such ceramic material GDP is exceeded by the thermal stresses imposed by heating and/or power application when creating or sustaining a plasma. Breakage or fracturing of the ceramic material undesirably introduces contaminants into the chamber during processing. The mechanical strength of a ceramic GDP can be increased by increasing the thickness of the plate; however, a "first wafer effect" undesirably results. The "first water effect" is a condition whereby a first number of wafers at the beginning of a process cycle are not properly processed due to a variety of conditions such as insufficient preheating of the GDP or poor active species concentration at the substrate surface. In other words, as plate thickness increases, the path to the substrate surface and recombination rate of the active species increases thereby reducing active species concentration. Moreover, in each of the types of GDPs discussed, there are no provisions in the construction or design to alleviate the thermal stress or etching problems.

Therefore, there is a need in the art for a GDP that exhibits high mechanical strength under thermal gradients, and is unaffected by the atmosphere that it services.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

SUMMARY OF THE INVENTION

The invention generally provides a fluid distribution plate for use in a substrate processing system. The fluid distribution plate comprises an inner disk and an outer ring disposed around the inner disk. The inner disk has a plurality of openings and at least one slot defined therein. At least one slot of the inner disk extends from a perimeter of the inner disk radially inward. The outer ring also has a plurality of openings and at least one slot that extends from an outer perimeter to an inner perimeter.

DETAILED DESCRIPTION

Figure 1:
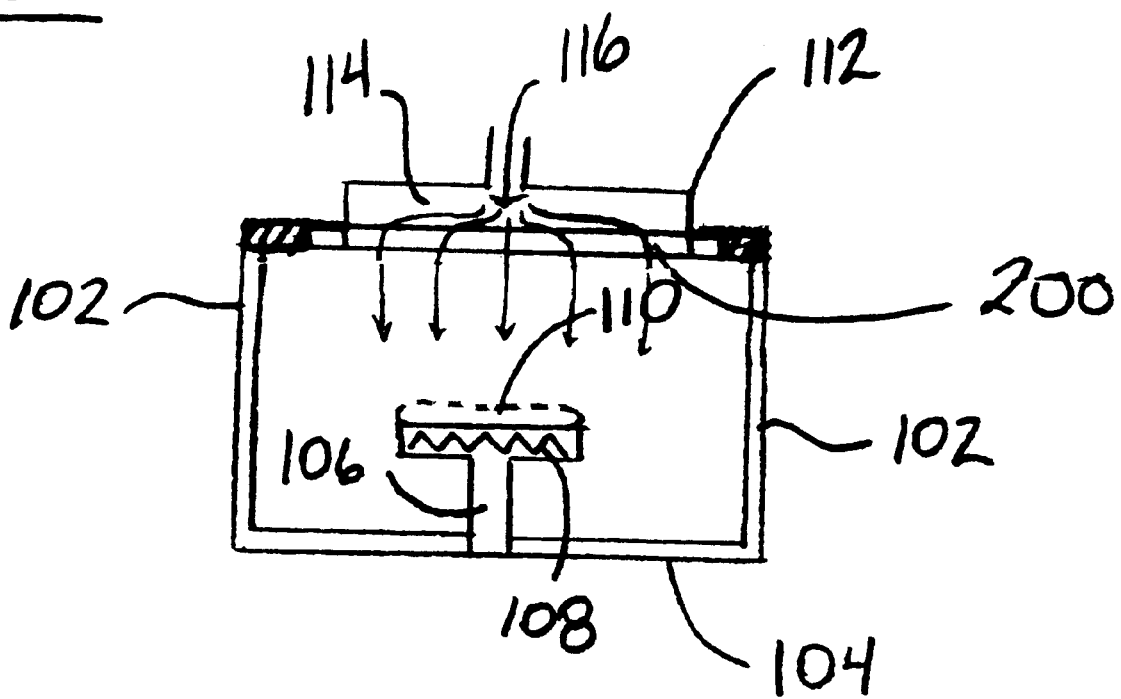
FIG. 1 depicts an enclosure containing an apparatus for delivering a fluid medium in accordance with the subject invention.

FIG. 1 depicts an enclosure 100 containing an apparatus 200 for delivering a fluid medium in accordance with the subject invention. More specifically, the enclosure 100 is a semiconductor wafer process chamber for performing etching (chemical and/or plasma enhanced) of a semiconductor substrate such as the ASP chamber manufactured and sold by Applied Materials, Inc. of Santa Clara, Calif. The ASP chamber may be used, for example, for stripping photoresist or passivating a semiconductor substrate. The enclosure 100 is defined by walls 102, a bottom 104 and a lid 112. Incorporated into or attached to the lid is an apparatus 200 for delivering a fluid medium, and more specifically, the apparatus 200 is a gas distribution plate. An upper enclosure 114 is defined by the gas distribution plate 200 and a portion of the lid 112. This enclosure 114 receives a flow of gas 116 which is used for processing a substrate 110. More specifically, within the enclosure 100 is a susceptor 106 which supports a substrate 110, e.g., a silicon wafer (shown in phantom). The susceptor 106 may also contain one or more elements 108 to control conditions within the chamber or susceptor including but not limited to electrodes for DC or RF power conduction for chucking, heating, and the like. The gas provided in the upper enclosure 114 passes through the gas distribution plate 200 and into the chamber 100 where the gas reacts with the substrate 110 to achieve a desired effect (e.g., etching a material layer from a predetermined area of the substrate 110).

Figure 2:
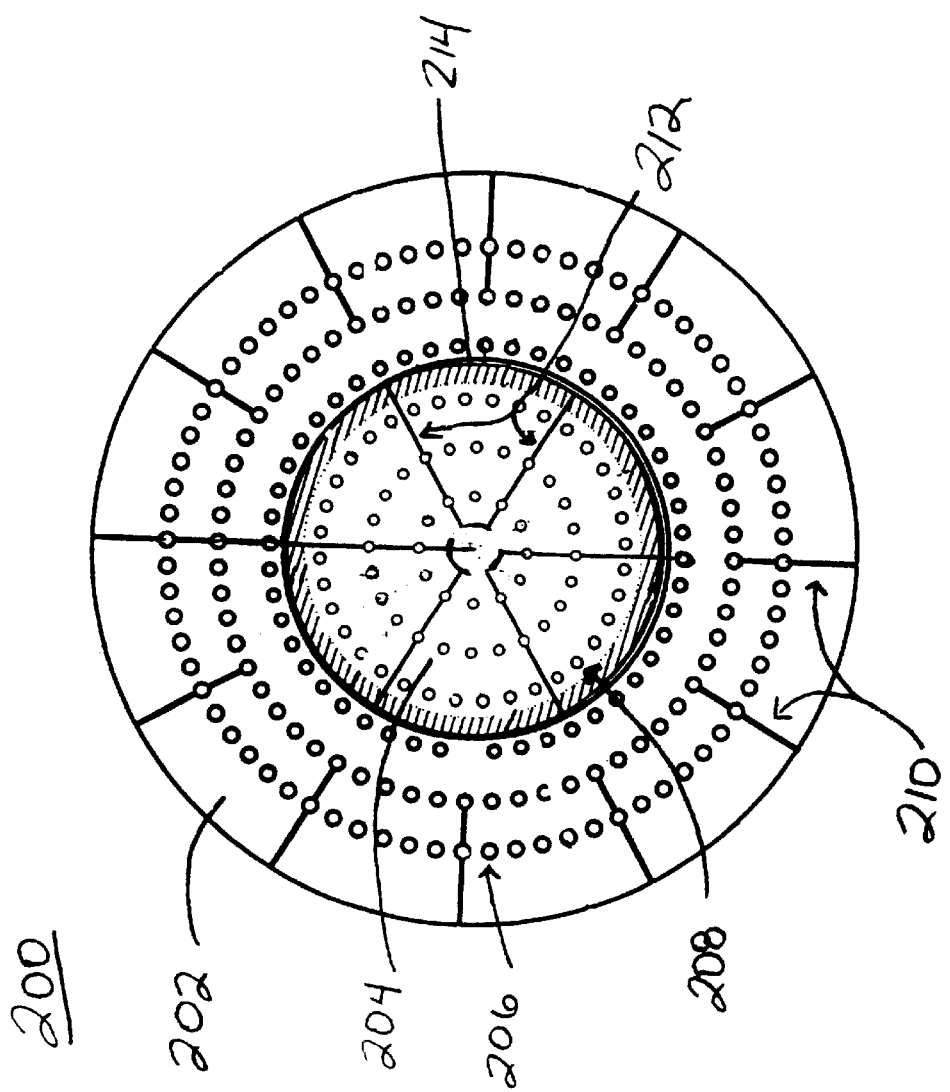
FIG. 2 depicts a top view of the apparatus in accordance with the subject invention.

FIG. 2 depicts a top view of the gas distribution plate 200. More specifically, the gas distribution plate 200 further comprises an outer ring 202 and an inner disk 204. The outer ring 202 further comprises a plurality of openings 206. Likewise, the inner disk 204 further comprises a plurality of openings 208. The plurality of openings (206 and 208) in both the outer ring 202 and inner disk 204, respectively, facilitates movement of the gas flow from the upper enclosure 114 into the chamber 100. In a preferred embodiment of the invention, the plurality of holes 208 on the inner disk 204 are arranged in a radially concentric manner—e.g., forming several concentric groups around a center 204C of the inner disk 204. The number of openings in each concentric group increases with the radial distance from the center 204C (shown in FIG. 5). Similarly, the plurality of openings 206 in the outer ring 202 are also arranged in a radially concentric manner, increasing in the number of openings as the radial distance increases. In general, depending on the specific needs and applications, other variations in the shape of the gas distribution plate 200 or arrangement of the plurality of openings (206 and 208) may also be used. For example, the plurality of openings 206 and 208 may be arranged according to certain regular or symmetric patterns, or may generally follow the shapes of the outer ring 202 and the inner disk 204. Other variations may also be appropriate to achieve desired results such as process uniformity, among others.

Additionally, the outer ring 202 is further provided with a plurality of slots 210 formed therein. Likewise, the inner disk 204 is provided with a plurality of slots 212 formed therein. The slots 210 and 212 generally extend along the radial directions on the outer ring 202 and the inner disk 204. In each component 202 and 204, the slots 210 and 212 allow for flexing and expansion due to thermal gradients.

Since the slots 210 and 212 may also affect gas flow through the gas distribution plate 200, design optimization of the outer ring 202 and inner disk 204 (e.g., locations, numbers and dimensions of slots 210 and 212 and openings 206 and 208, among others) is performed using both modelling and empirical data, in order to achieve mechanical designs that are compatible with desired process characteristics. These optimization procedures typically involve adjustment of multiple variables or trade-off of different constraints. For example, it is preferable that the region of highest heat loading—in this case, towards the center of the gas distribution plate 200, has the highest density of slots for stress relief. Furthermore, the locations, orientations and dimensions of slots 210 and 212 are also designed to provide sufficient thermal stress relief without compromising on the mechanical strength of the gas distribution plate 200. As for gas distribution, smaller openings tend to enhance process uniformity at the expense of process throughput due to a reduced etch rate. Thus, while the basic concept of the distribution plate of the present invention is generally applicable to a variety of processing systems, the choice of component parameters may vary with specific process applications. As such, specific details are disclosed herein for illustrative purposes.

In one embodiment, the gas distribution plate 200 is fabricated from a ceramic material such as alumina or an electrically conductive material such as silicon carbide (SiC) and aluminum nitride (AlN), which may be doped if necessary. In a preferred embodiment of the invention, the gas distribution plate 200 is comprised of alumina ($Al_2O_3$).

Figure 3:
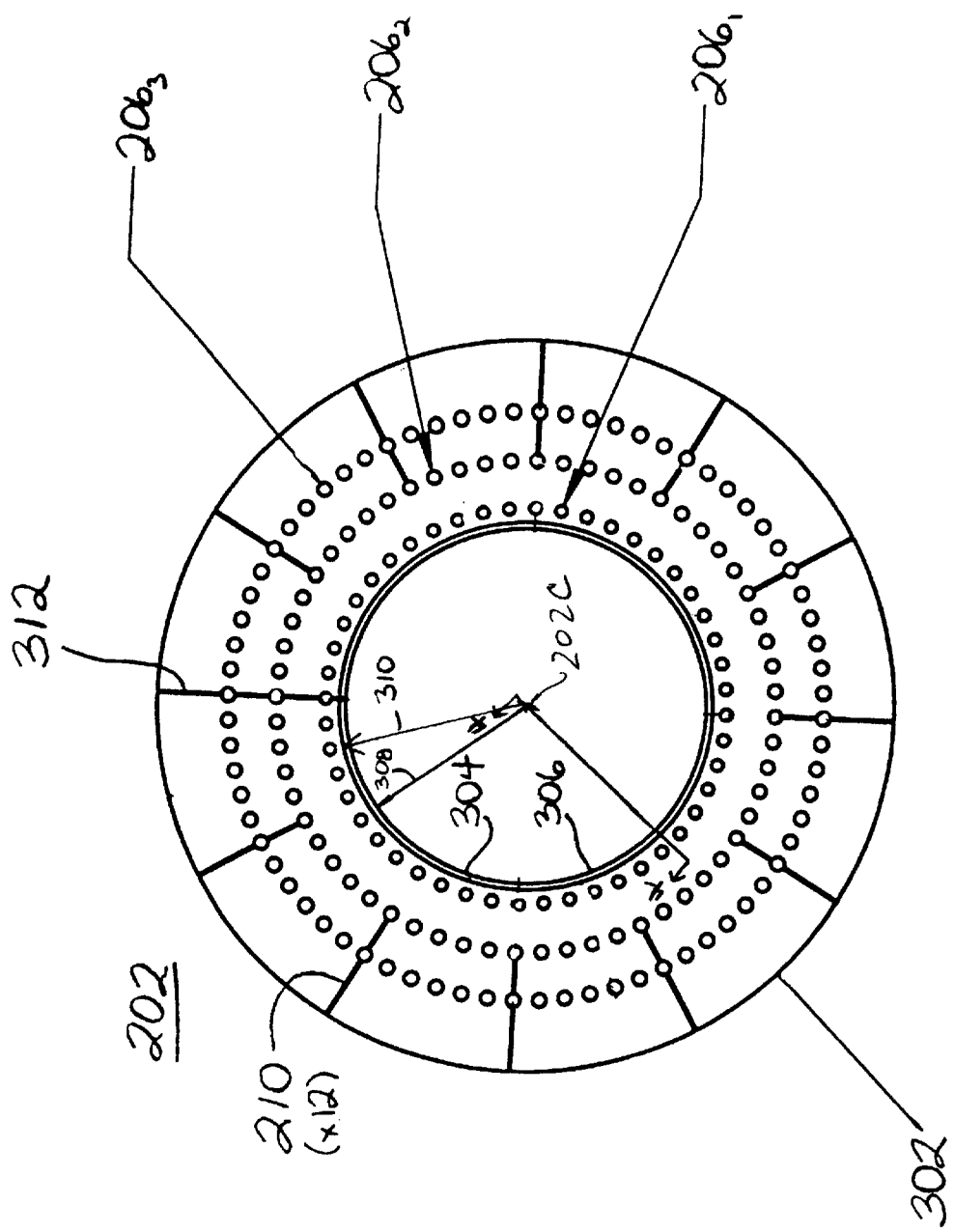
FIG. 3 depicts a top view of an outer ring portion of the subject invention.

FIG. 3 depicts a more detailed view of the outer ring 202 of the gas distribution plate 200. The outer ring 202 comprises an interior edge 306 (or inner perimeter) and a circumference 302 (or outer perimeter). In a preferred embodiment of the invention, there are three sets of radially concentric openings $206_1$, $206_2$ and $206_3$ in the outer ring 202. Specifically, a first set of openings $206_1$ is disposed most radially inward (closest to the interior edge 306) and further comprises 48 equally spaced openings. A second set of openings $206_2$ is disposed radially outward of the first set of opening $206_1$ and further comprises 60 equally spaced openings. A third set $206_3$ is disposed radially outward of the second set of openings $206_2$ and further comprises 72 equally spaced openings. In general, the three sets of openings $206_1$, $206_2$ and $206_3$ may have different diameters—e.g., the openings $206_1$ may have diameters ranging from about 0.05 to about 0.4 inches, while the $206_2$ and $206_3$ may have diameters ranging from about 0.05 to about 0.5 inches. In one embodiment, the diameters of the openings 206 increase with increasing radial distance from the interior edge 306. Specifically, the three sets of openings $206_1$, $206_2$ and $206_3$ have diameters of about 0.13 inches, 0.15 inches and 0.16 inches, respectively. These openings are arranged in three concentric circles with about 1 inch radial separation, with the first set of openings $206_1$ disposed at about 0.5 inches from the inner perimeter 306. In this embodiment, the outer ring has an inner diameter of about 4 inches, and an outer diameter of about 8.5 inches.

Additionally, the plurality of slots 210 is 12. The slots 210 start at the circumference 302 (or outer perimeter) of the outer ring 202 and extend radially inwards. At least one slot 312 extends from the circumference 302 to the interior edge 306 (or inner perimeter)—i.e., totally through the outer ring 202, to form a split ring construction for further flexibility. Although the slots 210 shown in FIG. 3 intersect openings 206 from both the second and third sets (e.g., $206_2$ and $206_3$), the invention also encompasses embodiments in which at least some slots 210 do not intersect any openings 206. It is preferable, however, that each slot 210 terminates at an opening (may be $206_1$, $206_2$ or $206_3$), because it is believed that such a configuration is advantageous for stress relief, especially in regions of high thermal gradients. It is also preferable that the slots 210 be as narrow as possible, in order to avoid excessive gases passing through the slots 210. In one embodiment, the width is about 0.02 inches, although other widths may also be used.

Figure 4:
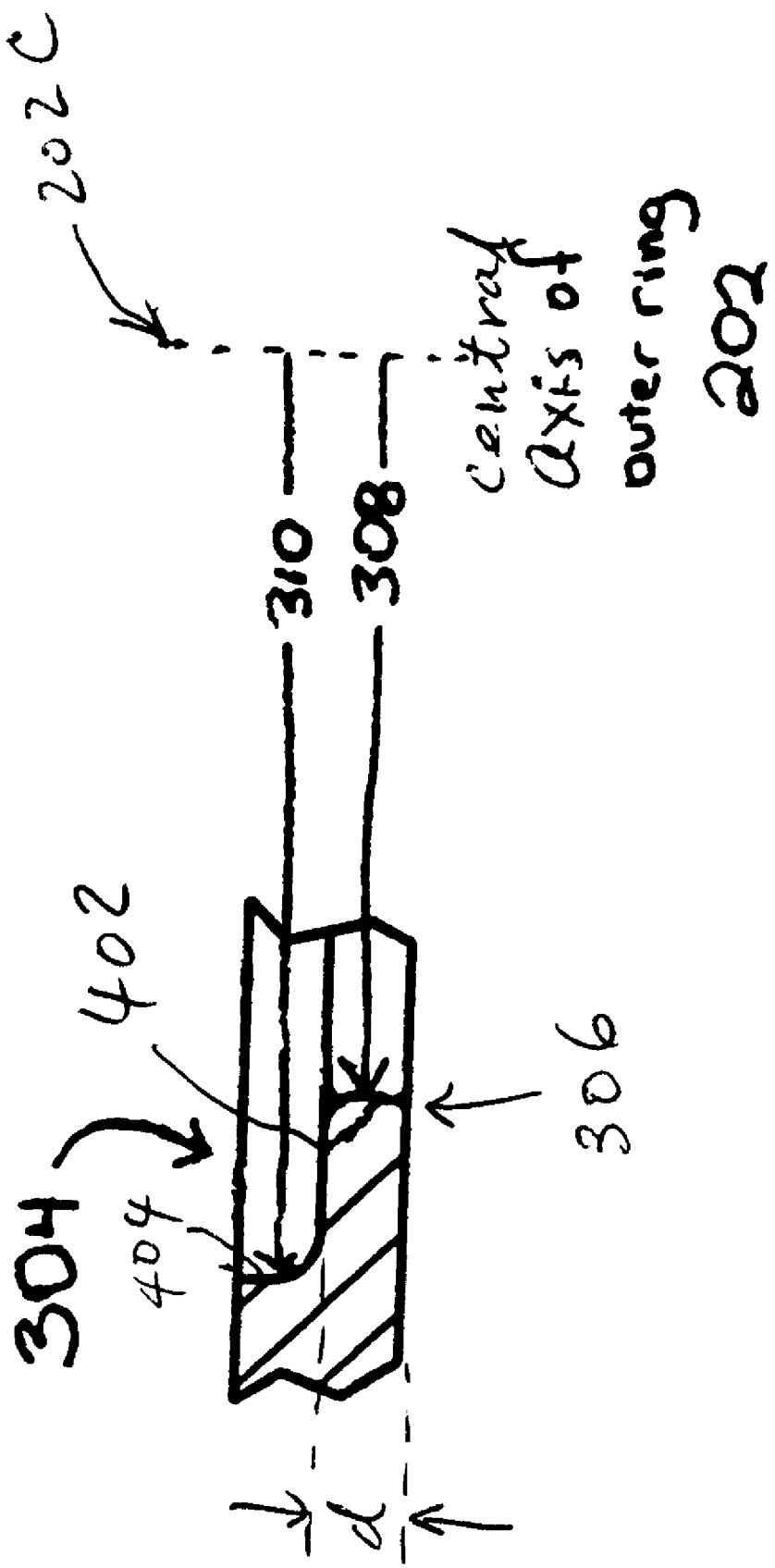
FIG. 4 depicts a partial cross-sectional view of the outer ring as seen along lines 4—4 of FIG. 3.

As shown in FIG. 3, a flange 304 is provided at the interior edge 306 of the outer ring 202. The flange 304 is characterized by an innermost radius 308 and an outer radius 310, as measured with respect to a central axis 202C perpendicular to the plane of the outer ring 202. FIG. 4 depicts a partial sectional view of the outer ring 202 as seen along a line 4—4 of FIG. 3. In one embodiment, the innermost radius 308 is approximately 2.07 inches and the outer radius 310 is approximately 2.14 inches. As such, the flange is approximately 0.07 inches in length. The flange 304 has a thickness d of about 0.05 inches (compared to about 0.1 inches for the outer ring 202) and provides adequate support for the inner disk 204, which rests on top of the flange 304 (not shown in FIG. 4).

Furthermore, the flange 304 is designed to accommodate for the expected thermal expansion of both the inner disk 204 and the outer ring 202. As such, the likelihood of breakage of either component is greatly reduced. For example, a small gap 214 (see FIG. 2) between the outer ring 202 and the inner disk 204 allows for thermal expansion of the components. The extent of the gap 214 depends on the dimensions and relative positioning of the inner disk 204 on the outer ring 202, and is typically less than about 0.04 inches. In one embodiment, the gap 214 is about 0.02 inches when the outer ring 202 and the inner disk 204 are concentrically positioned. Since hot process gas flow 116 strikes the inner disk 204 first, the inner disk 204 will experience greater thermal gradients; hence expansion, than the outer ring 202. It has been seen that the inner disk temperature will rise to a range of approximately 500–800° C. whereas the outer ring temperature will rise to only approximately 200° C. As the inner disk 204 and outer ring 204 expand, their separation (or the dimension of the gap 214) may vary along the perimeter 502 of the inner disk 204.

Additionally, at least a top surface 402 of the flange 304 (see FIG. 4) and a peripheral zone 508 (see FIG. 5) of the inner disk 204 are highly polished to remove any loose particles and to prevent particle generation caused by grinding (or rubbing) of the outer ring 202 and inner disk 204 due to thermal expansion. Such particles, if not removed, can be introduced into the chamber and contaminate the etch process. Since the inner disk 204 can be supported on either of its horizontal surfaces upon the flange 304, both horizontal surfaces (or top and bottom) of the inner disk 204 are polished, at least at the peripheral zone 508, or portions of the inner disk 204 that are supported by the flange 304. In one embodiment, the peripheral zone 508 extends about 0.2 inches inward from the outer perimeter 302. Preferably, these contact surfaces are polished to a tolerance of approximately the grain size of the materials of these components, in order to greatly reduce grinding and particle generation. For example, a 300-fold reduction in particle generation can be achieved with the polished surfaces. In the case of alumina components, a 4 μm polishing tolerance is acceptable. Although a vertical side (not shown) of the inner disk 204 may contact the vertical edge 404 of the outer ring 202 due to thermal expansion, these vertical surfaces do not generally need to be polished because this type of contact (without a rubbing motion) do not pose serious problems with particle generation.

Figure 5:
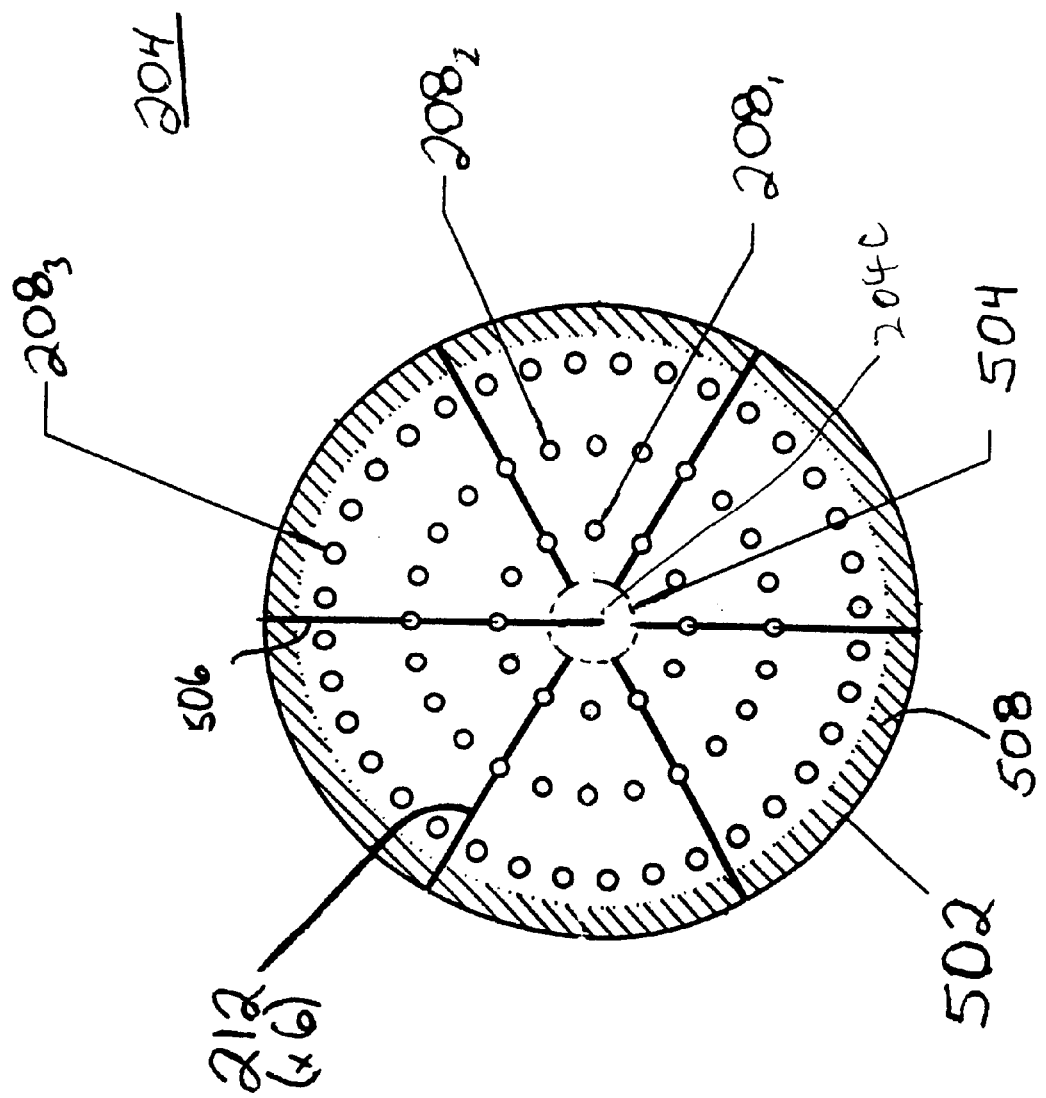
FIG. 5 depicts a top view of a center disk portion of the subject invention.

FIG. 5 depicts a more detailed top view of the inner disk 204 of the subject invention. For sake of clarity, the inner disk 204 has been slightly enlarged. In a preferred embodiment of the invention, three sets of openings $208_1$, $208_2$ and $208_3$ are arranged in a radially concentric manner with respect to the center 204C of the inner disk 204. More specifically, a first set of openings $208_1$ is disposed most radially inward, and comprises 12 equally spaced openings. A second set of openings $208_2$ is disposed radially outward of the first set of opening $208_1$, and comprises 24 equally spaced openings. A third set of openings $208_3$ is disposed radially outward of the second set of openings $208_2$, and further comprises 36 equally spaced openings. The three sets of openings $208_1$, $208_2$ and $208_3$ may have different diameters—for example, the openings $208_1$ may range from about 0.02 to about 0.20 inches in diameter, while the openings $208_2$ and $208_3$ may have diameters ranging from about 0.04 to about 0.3 inches. In one embodiment, the openings $208_1$, $208_2$ and $208_3$ have respective diameters of about 0.08, 0.11 and 0.13 inches, and are arranged as three concentric circles with diameters of about 1.3, 2.4 and 3.5 inches, respectively.

Additionally, the plurality of slots 212 is six, and they extend from an outer diameter (or perimeter) 502 of the inner disk 204 radially inwards. It is preferable that the slots 212 be as narrow as possible in order to avoid adverse effects on the gas flow. For example, the slots 212 typically have a width of about 0.02 inches, although other widths may also be acceptable. At least some of the slots 212 terminate at a certain radial distance from the center 204C of the inner disk 204, with the loci of the terminating points form a circle 504, as shown in FIG. 5. The diameter of the circle 504 is dependent upon and should be smaller than the diameter of the gas flow 116. For example, the diameter of the circle 504 is approximately 0.6 in. when using a 1 in. diameter gas delivery pipe for the gas flow 116. By having at least some slots 212, or preferably a majority of them, extending inside the diameter of the gas flow 116, the thermally-induced stress on the inner disk 204 (due to the hot gas flow 116) can be adequately relieved to avoid damage to the gas distribution plate 200. Additionally, one slot 506 may extend from the circumference or outer perimeter 502 to the center 204C—i.e., totally through the inner disk 204 to form a split disk construction for further flexibility.

The configuration shown in FIG. 5—with the slots 212 intersecting some of the openings $208_1$ and $208_2$, is also meant to be illustrative. In general, the invention encompasses other embodiments in which some slots 212 may not intersect any openings 208. Furthermore, since the region near the center 204C tends to be more uniformly heated, i.e., lower thermal gradients, there is less of an advantage (or need) for the slots 212 to terminate at an opening 208 close to the center 204C. Instead, from a gas flow uniformity point of view, it is preferable that the openings 208 not be located inside the diameter of the gas flow 116, in order to avoid excessive gas flow through that central region of the inner disk 204.

Although several embodiments which incorporate the teachings of the present invention have been shown and described in detail herein, those skilled in the art can readily devise many other varied embodiments that still incorporate these teachings. For example, the number of slots 210 and 212, or the number of openings 208 and 206, can be configured in any number or layout as is desirable to achieve a beneficial gas flow and thermal expansion handling capabilities. Although a disk/single ring combination is shown and described, other combinations are possible such as multiple rings, arc segments and the like, depending upon manufacturing and design costs or process considerations. One or more of the slots 210 of the outer ring 202 can also be formed from the interior edge 306 and extend radially outward, or may also be orientated in different directions, other than the radial direction. Although the use of ceramic materials is disclosed, conductive materials such as SiC and AlN discussed above or similar materials may be used to fabricate the GDP. Such conductive materials are capable of carrying away charges within the gas flow before they reach the substrate. This is beneficial because as semiconductor device tolerances decrease, the need to control the charge density at a substrate surface during processing increases. Reduced charge density at the substrate surface improves the quality and reliability of the devices formed thereupon. Furthermore, although the gas distribution plate has been described for use with an ASP chamber, it can also be applied to other substrate processing systems to avoid potential thermal stress problems.

What is claimed is:

1. A fluid distribution plate for use in a substrate processing system, comprising:
   an inner disk having a plurality of openings and at least one slot defined therein; and
   an outer ring having a plurality of openings and at least one slot defined therein and disposed around the inner disk, where at least one slot extends entirely through the outer ring and a gap is defined between the inner disk and outer ring.

2. The fluid distribution plate of claim 1, wherein the at least one slot of the inner disk extends from a perimeter of the inner disk radially inward.

3. The fluid distribution plate of claim 1, wherein a gap is defined between an inner perimeter of the outer ring and a perimeter of the inner disk.

4. The fluid distribution plate of claim 1, wherein the outer ring has twelve slots defined therein.

5. The fluid distribution plate of claim 1, wherein the at least one slot of the outer ring extends from an outer perimeter of the inner disk radially inward.

6. The fluid distribution plate of claim 5, wherein the at least one slot of the outer ring extends from the outer perimeter to an inner perimeter of the outer ring.

7. The fluid distribution plate of claim 1, wherein the inner disk has six slots defined therein.

8. The fluid distribution plate of claim 1, wherein the at least one slot of the outer ring extends from an outer perimeter and terminates at one of said plurality of openings of said outer ring.

9. The fluid distribution plate of claim 1, wherein the outer ring further comprises a flange disposed at an inner perimeter of the outer ring.

10. The fluid distribution plate of claim 9, wherein a peripheral zone of the inner disk is supported by the flange of the outer ring.

11. The fluid distribution plate of claim 10, wherein a top surface of the flange contacts a surface of the inner disk at the peripheral zone, and both the top flange surface and the inner disk surface at the peripheral zone are highly polished.

12. The fluid distribution plate of claim 1, wherein the plurality of openings of the inner disk are arranged in a radially concentric manner on the inner disk.

13. The fluid distribution plate of claim 1, wherein the plurality of openings of the outer ring are arranged in a radially concentric manner on the outer ring.

14. The fluid distribution plate of claim 1, wherein the inner disk and the outer ring are fabricated from a ceramic material.

15. The fluid distribution plate of claim 14, wherein the ceramic material is alumina.

16. The fluid distribution plate of claim 1, wherein the inner disk and the outer ring are fabricated from an electrically conductive material.

17. A fluid distribution plate for use in a substrate processing system, comprising:
   an inner disk having a plurality of openings defined therein and at least one slot extending from a perimeter of the inner disk radially inward; and
   an outer ring disposed around and spaced apart from the inner disk; the outer ring having a plurality of openings defined therein and at least one slot extending entirely through the outer ring from an outer perimeter to an inner perimeter and a gap is defined between the inner disk and outer ring.

18. The fluid distribution system of claim 17, wherein the plurality of openings of the inner disk and the plurality of openings of the outer ring allow distribution of a gas over a substrate inside the substrate processing system.

* * * * *